United States Patent [19]

Hall et al.

[11] 4,000,440
[45] Dec. 28, 1976

[54] METHOD AND APPARATUS FOR CONTROLLING BRIGHTNESS AND ALIGNMENT OF A BEAM OF CHARGED PARTICLES

[75] Inventors: Alan V. Hall, Wappingers Falls; Merlyn H. Perkins, Hopewell Junction, both of N.Y.; Hans C. Pfeiffer, Ridgefield, Conn.; Edward V. Weber; Ollie C. Woodard, both of Poughkeepsie, N.Y.

[73] Assignee: International Business Machines Corporation, Armonk, N.Y.

[22] Filed: July 26, 1974

[21] Appl. No.: 492,096

[52] U.S. Cl. ............................... 315/383; 315/30; 315/307; 315/389

[51] Int. Cl.² .................... H01J 29/52; H01J 29/54

[58] Field of Search ......................... 315/383–385, 315/387–389, 307, 30

[56] References Cited

UNITED STATES PATENTS

| | | | |
|---|---|---|---|
| 3,619,717 | 11/1971 | Lee | 315/383 |
| 3,644,700 | 2/1972 | Kruppa | 315/384 |

*Primary Examiner*—Maynard R. Wilbur
*Assistant Examiner*—Richard E. Berger
*Attorney, Agent, or Firm*—Frank C. Leach, Jr.; Theodore E. Galanthay

[57] ABSTRACT

A beam of charged particles has its alignment and brightness alternately controlled in accordance with the current of the beam. The measurements of the current and any corrections for alignment or brightness are made when the beam is not applied to a target.

19 Claims, 6 Drawing Figures

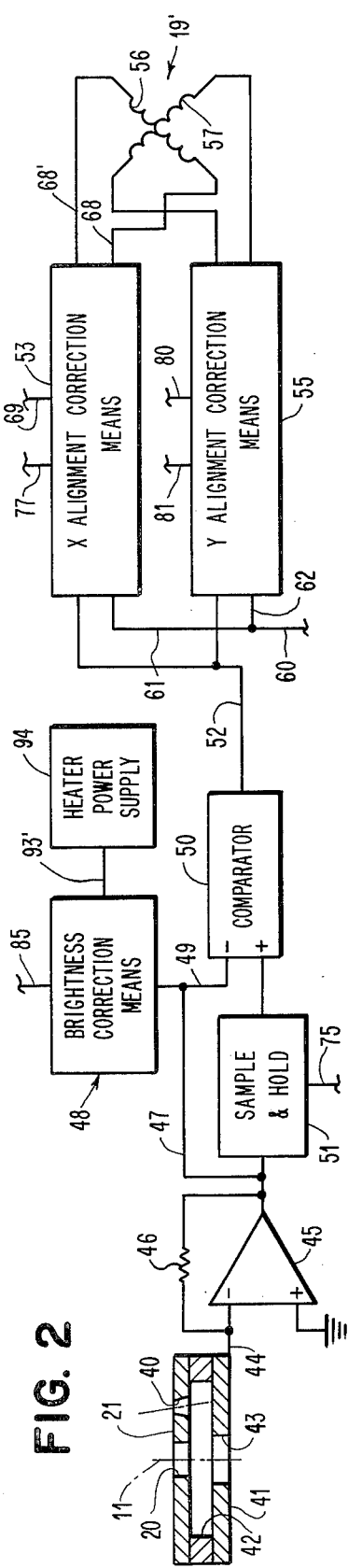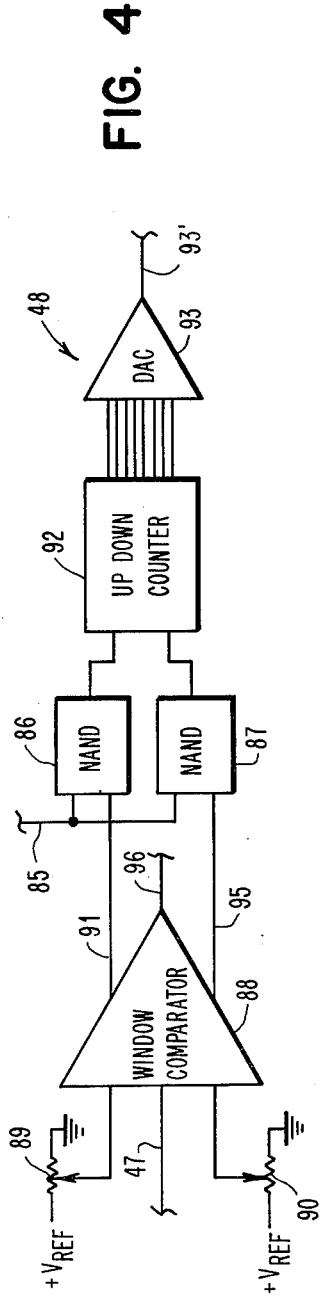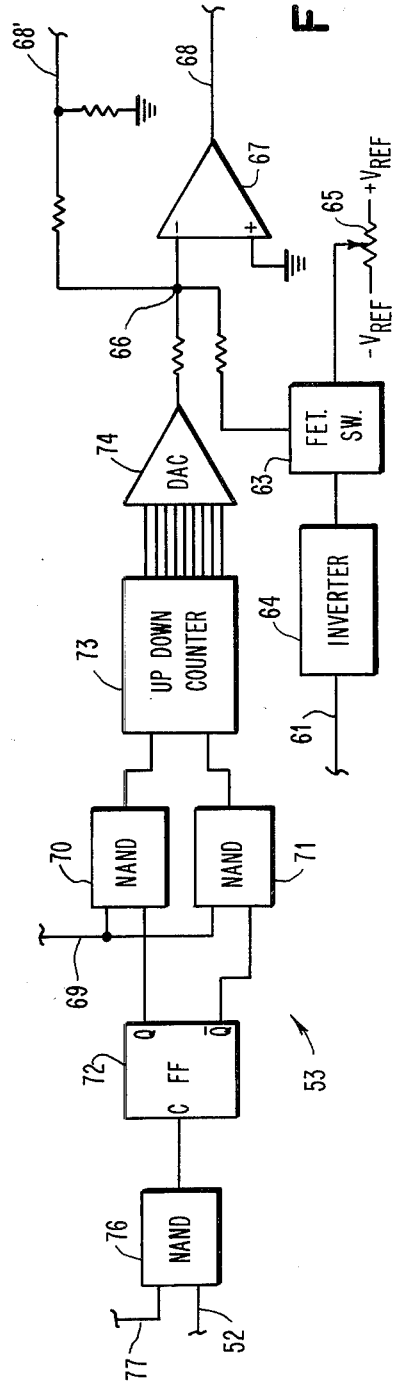

METHOD AND APPARATUS FOR CONTROLLING BRIGHTNESS AND ALIGNMENT OF A BEAM OF CHARGED PARTICLES

In U.S. Pat. No. 3,644,700 to Kruppa et al and the copending patent application of Michel S. Michail et al for "Method And Apparatus For Positioning A Beam Of Charged Particles," Ser. No. 437,585, filed Jan. 28, 1974, now U.S. Pat. No. 3,900,736 and assigned to the same assignee as the assignee of this application, there are shown a method and apparatus for controlling a square-shaped beam. The beam is deflected throughout a writing field on a semiconductor wafer to write a desired pattern.

To be able to apply the beam at the desired positions, the beam must be properly aligned. If the beam is not properly aligned, the beam will not produce the desired pattern. The alignment requires that the beam have a substantially uniform current density so that the current of the beam is symmetrically distributed.

To insure that the beam has a substantially uniform current density, it also is necessary that its brightness be maintained at a substantially constant level to insure a desired total beam current. Because the brightness depends upon the relationship between the cathode temperature and the cathode emission, it is necessary to correct for brightness of the beam if the beam is to be properly aligned. This is because a slight change in the temperature of the cathode heater can cause a substantial change in the current density of the beam through substantially changing the total current of the beam. If the beam does not have the desired total current, it cannot be properly aligned.

If the beam is not properly aligned, the current for the cathode heater might be increased until a maximum beam current was produced by the cathode so that the total beam current would be in a desired range. If this were to occur, the life of the cathode would be substantially reduced.

The present invention satisfactorily solves the foregoing problems through providing a method and apparatus for alternately correcting the alignment and brightness of the beam. These corrections occur when the target is being moved to another position as described in the aforesaid Kruppa et al patent and the aforesaid Michail et al application. By alternately correcting for alignment and brightness of the beam, the beam can be properly aligned since the beam has a current density of a desired magnitude from the prior brightness correction cycle providing the desired total beam current. Similarly, since the beam is aligned from the prior alignment correction cycle, the brightness level can be controlled without having to increase the heater current to obtain a maximum current output from the cathode.

An object of this invention is to maintain a beam of charged particles with a desired total current and a substantially uniform current density.

Another object of this invention is to provide a method and apparatus for sequentially optimizing the alignment and brightness of a beam of charged particles.

The foregoing and other objects, features, and advantages of the invention will be apparent from the following more particular description of the preferred embodiment of the invention as illustrated in the accompanying drawings.

In the drawings:

FIG. 2 is a schematic block diagram showing the circuitry for controlling the alignment and brightness of the beam of FIG. 1.

FIG. 3 is a schematic block diagram of an X alignment correction means of the circuit of FIG. 2.

FIG. 4 is a schematic block diagram of a brightness correction means of the circuit of FIG. 2.

Figure 1:
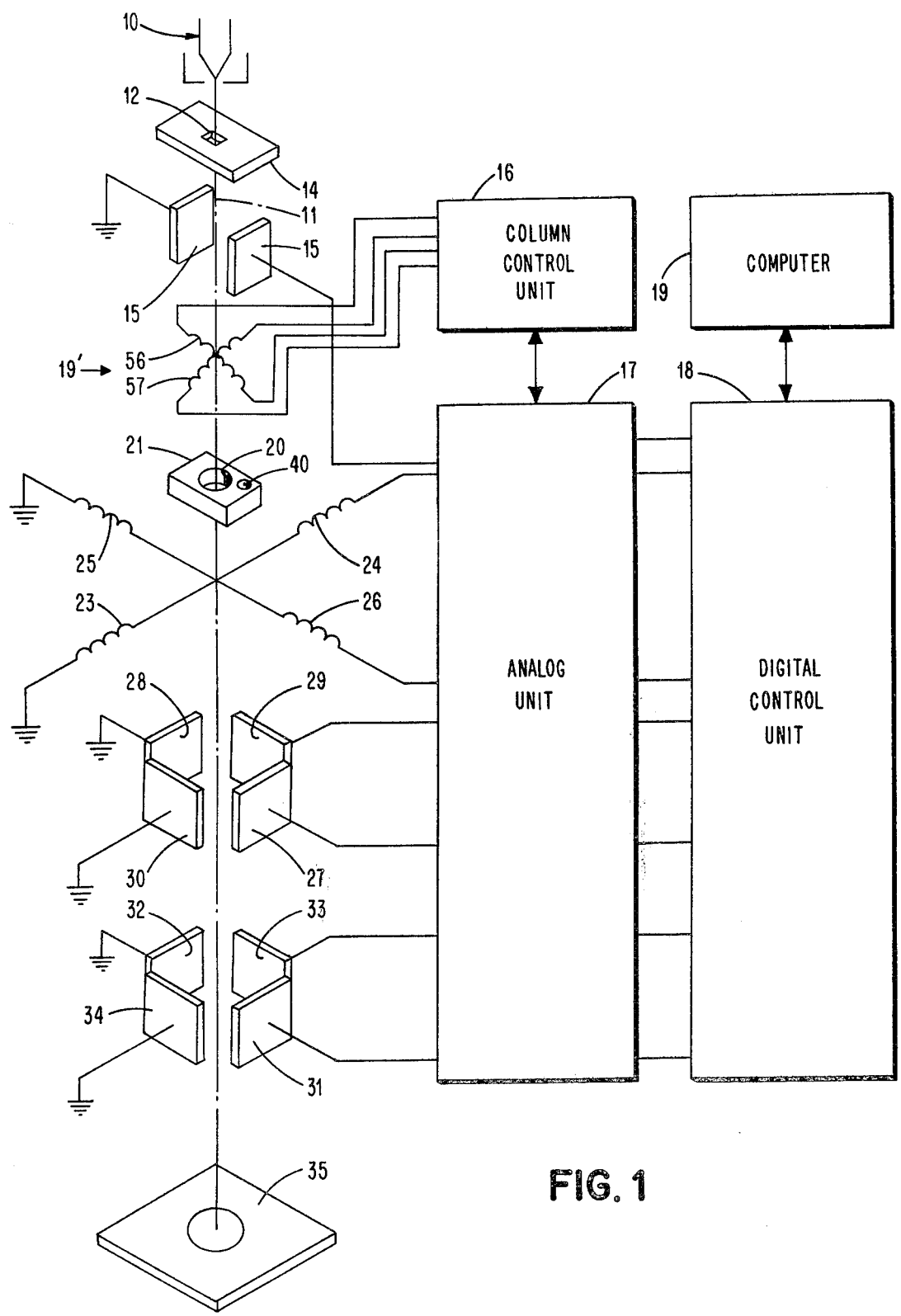
FIG. 1 is a schematic view showing a beam of charged particles and the apparatus for controlling the beam with which the method and apparatus of the present invention is employed.

Referring to the drawings and particularly FIG. 1, there is shown an electron gun 10 for producing a beam 11 of charged particles in the well-known manner. As shown and described in the aforesaid Michail et al application, the electron beam 11 is passed through an aperture 12 in a plate 14 to shape the beam 11. The beam 11 is preferably square shaped and has a size equal to the minimum line width of the pattern that is to be formed.

The beam 11 passes between a pair of blanking plates 15, which determine when the beam 11 is applied to the material and when the beam 11 is blanked. The blanking plates 15 are controlled by circuits of an analog unit 17, which has a column control unit 16 connected thereto.

The analog unit 17 is controlled by a digital control unit 18 in the manner more particularly shown and described in the copending patent application of Philip M. Ryan for "Method And Apparatus For Controlling Movable Means Such As An Electron Beam," Ser. No. 398,734, filed Sept. 19, 1973, now U.S. Pat. No. 3,866,013, and assigned to the same assignee as the assignee of this application. The digital control unit 18 is connected to a computer 19, which is preferably an IBM 370 computer.

After passing through the blanking plates 15, the beam passes through an alignment yoke 19'. The alignment yoke 19' is controlled by circuits within the column control unit 16.

The beam 11 then passes through a circular aperture 20 in a plate 21. This controls the beam 11 so that only the charged particles passing through the centers of the lenses (not shown) are used so that a square-shaped spot without any distortion is produced.

The beam 11 is next directed through magnetic deflection coils 23, 24, 25, and 26. The magnetic deflection coils 23 and 24 control the deflection of the beam 11 in a horizontal or X direction while the magnetic deflection coils 25 and 26 control the deflection of the beam 11 in a vertical or Y direction. Accordingly, the coils 23–26 cooperate to move the beam 11 in a horizontal scan by appropriately deflecting the beam 11.

While the beam 11 could be moved in a substantially raster fashion as shown and described in the aforesaid Kruppa et al patent, it is preferably moved in a back and forth scan so that the beam 11 moves in opposite directions along adjacent lines as shown and described in the aforesaid Ryan and Michail et al applications. Thus, the negative bucking sawtooth of the type shown in FIG. 3b of the aforesaid Kruppa et al patent is supplied to the coils 23 and 24 during forward scan while a positive bucking sawtooth, which is of opposite polarity to the sawtooth shown in FIG. 3b of the aforesaid Kruppa et al patent, is supplied to the coils 23 and 24 during the backward scan.

As shown and described in the aforesaid Michail et al application, the beam 11 then passes between a first set of electrostatic deflection plates 27, 28, 29, and 30. The electrostatic deflection plates 27 and 28 cooperate to deflect the beam in a horizontal or X direction while the electrostatic deflection plates 29 and 30 cooperate to move the beam 11 in the vertical or Y direction. The plates 27–30 are employed to provide any desired offset of the beam 11 at each of the predetermined positions or spots to which it is moved. In the aforesaid Kruppa et al patent, the plates 27–30 corrected for linearity, but these correction signals are supplied to the coils 23–26 in the aforesaid Michail et al application and in this application.

After passing between the electrostatic deflection plates 27–30, the beam 11 then passes between a second set of electrostatic deflection plates 31, 32, 33, and 34. The electrostatic deflection plates 31 and 32 cooperate to deflect the beam 11 in the horizontal or X direction while the electrostatic deflection plates 33 and 34 cooperate to deflect the beam 11 in the vertical or Y direction. The plates 31 and 32 deflect the beam 11 in the X direction, and the plates 33 and 34 deflect the beam 11 in the Y direction from each of the predetermined positions to which it is moved in accordance with its predetermined pattern so that the beam 11 is applied to its actual position based on the deviation of the area from its designed position, both shape and location, in which the beam 11 is to write as more particularly shown and described in the aforesaid Michail et al application.

The beam 11 is then applied to a target, which is supported on a table 35 and can be a semiconductor wafer, for example. The table 35 is movable in the X and Y directions as more particularly shown and described in the aforesaid Kruppa et al patent.

The beam 11 is moved through A, B, and C cycles as shown and described in the aforesaid Kruppa et al patent and the aforesaid Michail et al application. The present invention is particularly concerned with supplying signals to automatically correct the alignment and brightness of the beam 11 alternately during most of the C cycles.

As more particularly shown and described in the aforesaid copending patent application of Hans C. Pfeiffer et al for "Method And Apparatus For Aligning Electron Beams," Ser. No. 393,365, filed Aug. 31, 1973, now U.S. Pat. No. 3,894,271, and assigned to the same assignee as the assignee of this application, the plate 21 has a sample aperture 40, which is circular, formed therein and to which the beam 11 is deflected during the C cycles. A sensing plate 41 is positioned just beneath the plate 21 and spaced therefrom by a thin disc 42 of mica or other suitable insulating material. The disc 42 is very thin to avoid any charging problems. The sensing plate 41 has a central circular aperture 43, which is in alignment with the aperture 20 in the plate 21 and larger than the aperture 20 so that the sensing plate 41 will not interfere with the normal operation of the beam 11.

The current collected by the sensing plate 41 from the beam 11 passing through the sample aperture 40 is a maximum when the beam 11 is properly centered with respect to the aperture 20 in the plate 21. This is because any beam misalignment at the aperture 20 in the plate 21 has an equivalent misalignment at the sample aperture 40 when the beam 11 is directed through the sample aperture 40.

Accordingly, the current on an output line 44 of the sensing plate 41 is directly related to the current density of the beam. This is because the beam has its maximum current density when it is properly aligned since it has symmetrical current distribution throughout the sample aperture 40.

Similarly, the current collected by the sensing plate 41 also is related to the brightness level of the beam 11. That is, the total current collected by the sensing plate 41 is directly proportional to the brightness level of the beam 11 so that an increase in the current on the output line 44 indicates an increase in the brightness level, which is the total current of the beam 11, and vice versa.

The output of the current from the sensing plate 41 is connected through the output line 44 to the negative input of an operational amplifier 45, which has its positive input grounded. The amplifier 45 functions as a current to voltage converter and produces an output voltage equal to the negative of the product of the current from the line 44 and the resistance of a resistor 46, which provides the feedback from the output of the amplifier 45 to the negative input of the amplifier 45.

The output of the amplifier 45 is connected by a line 47 to a brightness correction means 48 and by a line 49 to the negative input of a comparator 50. The positive input of the comparator 50 is from the output of a sample and hold circuit 51, which has its input connected to the output of the amplifier 45. The output of the comparator 50 is supplied by a line 52 to an X alignment correction means 53 and to a Y alignment correction means 55.

The X alignment correction means has its output connected to an X alignment coil 56 of the alignment yoke 19'. The Y alignment correction means 55 has its output connected to a Y alignment coil 57 of the alignment yoke 19'.

It should be understood that the operation of the correction of the alignment of the beam 11 is substantially the same as that described in the aforesaid Pfeiffer et al application. During a C cycle when there is correction for alignment of the beam 11, each of the X alignment coil 56 and the Y alignment coil 57 has four corrections during the C cycle with the corrections being alternated between the X alignment coil 56 and the Y alignment coil 57.

If it is assumed that the beam 11 was corrected for brightness during the prior cycle and the C cycle is to start, a positive pulse is supplied from the analog unit 17 to start the C cycle. This positive pulse causes a negative OFFSET signal to be supplied from the analog unit 17 through a line 60 and a line 61 to the X alignment correction means 53 and through the line 60 and a line 62 to the Y alignment correction means 55. Since the circuitry for the Y alignment correction means 55 is the same as the circuitry for the X alignment correction means 53, the description will refer only to the X alignment correction means 53.

When the OFFSET signal on the line 60 goes low to a logical zero, an electronic switch 63 (see FIG. 3), which is preferably an FET switch, is closed since the negative pulse on the line 61 is converted to a positive pulse by an inverter 64 prior to being supplied to the electronic switch 63. The closing of the switch 63 connects a potentiometer 65 to a summing point 66 of a summing amplifier 67, which supplies its output over lines 68 and 68' to the X alignment coil 56. The potentiometer 65 is adjusted manually at the time of set up of the apparatus for producing the electron beam 11 so that the maximum current of the beam 11 through the sample aperture 40 with the switch 63 closed corresponds to the maximum current of the beam 11 applied to the target when the switch 63 is open.

Figure 6:
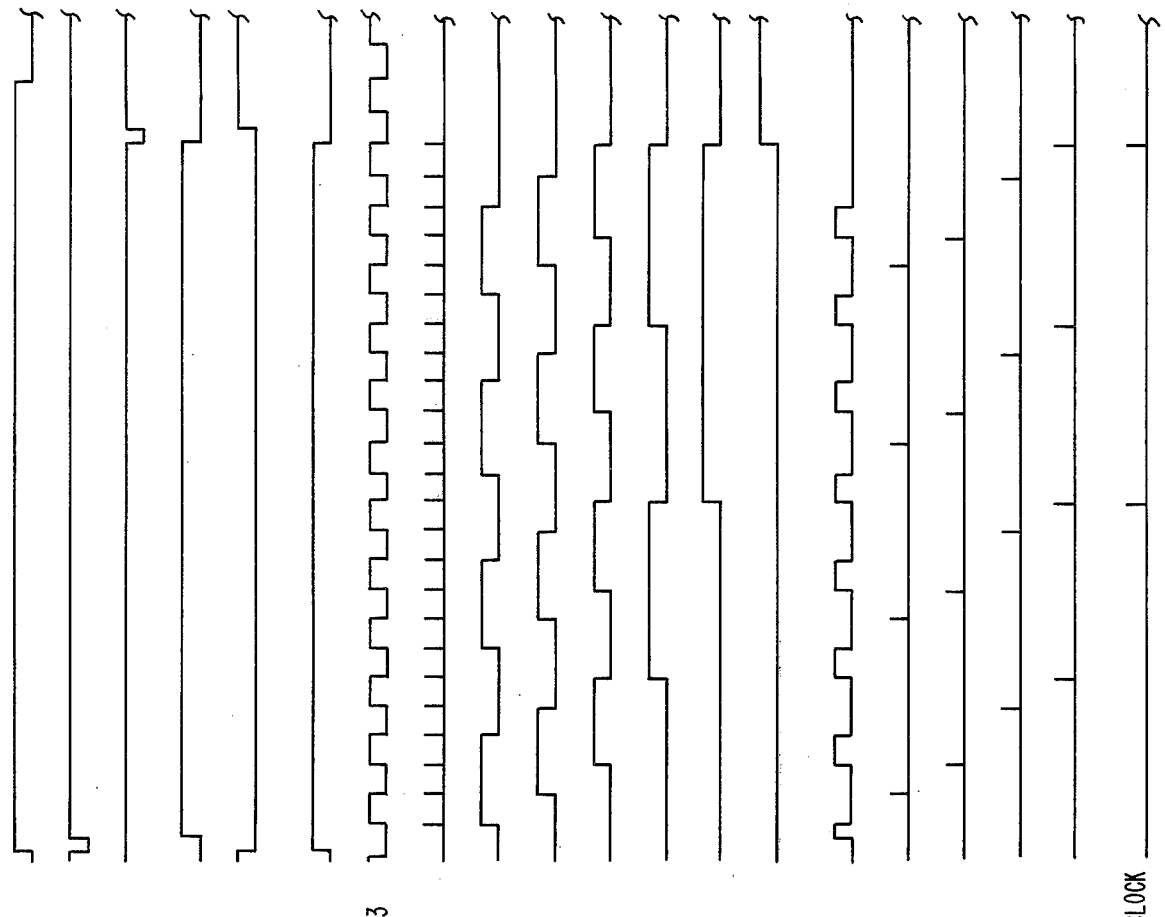
FIG. 6 is a timing diagram showing the relationship of various portions of the circuits of FIGS. 2 to 5.

As a result of the negative OFFSET signal, the beam 11 is deflected to the sample aperture 40. After a slight delay to allow the beam 11 to be deflected to the sample aperture 40, a positive BEAM ON pulse is supplied to the blanking plates 15 from the analog unit 17. Thus, the beam 11 is applied to the sensing plate 41 (see FIG. 2) through the sample aperture 40 when the blanking plates 15 are not blanking the beam 11. This relationship of the OFFSET, BEAM ON, and C cycle signals is shown in FIG. 6.

With the sample and hold circuit 51 holding an output from the amplifier 45, a positive pulse $C_x$ is supplied over a line 69 (see FIG. 3) as one input to each of NAND gates 70 and 71 shortly after the BEAM ON signal goes positive. The NAND gate 70 has its other input connected to output Q of a flip flop 72, and the NAND gate 71 has its other input connected to output $\overline{Q}$ of the flip flop 72.

Depending on the states of the flip flop 72, one of the NAND gates 70 and 71 will have two high or logical one inputs when the positive pulse $C_x$ is supplied on the line 69. As a result, one of the NAND gates 70 and 71 produces a negative pulse as an output to an up down counter 73 when the positive pulse $C_x$ is supplied on the line 69. At the start of the alignment correction cycle, the state of the flip flop 72 will be that from the prior alignment correction cycle, which occurred previous to the cycle in which correction for the brightness of the beam 11 occurred.

The output of the up down counter 73 is supplied through a digital to analog converter (DAC) 74 to the summing amplifier 67. If the NAND gate 70 supplies the signal to the up down counter 73, then the DAC 74 produces an increasing output to the summing amplifier 67 and the X alignment coil 56. If the NAND gate 71 supplies the negative pulse to the up down counter 73, then the DAC 74 decreases its output to the summing amplifier 67 and the X alignment coil 56.

The change in the current through the X alignment coil 56 causes a change in the current density of the beam 11 supplied to the sensing plate 41 since it slightly shifts the current distribution of the beam 11. As a result, the output of the amplifier 45 changes and is compared in the comparator 50 with the output of the sample and hold circuit 51, which is supplying a voltage output correlated to the current density of the beam 11 prior to changing the current in the X alignment coil 56.

The sample and hold circuit 51 samples the output of the amplifier 45 each time that a SAMPLE pulse on a line 75 is high or logical one. Since the SAMPLE pulse usually goes positive for a short period of time prior to a change being made in the current to the X alignment coil 56 as shown by the relation of $C_x$ to SAMPLE in FIG. 6, the output of the sample and hold circuit 51 at the start of alignment is usually a full sample from this alignment cycle or partially from this alignment and cycle and partially from the prior alignment cycle.

If the voltage output of the amplifier 45 is greater than the output of the sample and hold circuit 51, then the output of the comparator 50 is low or logical zero. If the output of the amplifier 45 is less than the output of the sample and hold circuit 51, then the output of the comparator 50 is high or logical one.

If the output of the comparator 50 is low, this indicates that the change in the current in the X alignment coil 56 improved the alignment since the current in the beam 11 increased. Thus, the logical zero output of the comparator 50 is supplied by the line 52 as one input to a NAND gate 76 (see FIG. 3). The other input to the NAND gate 76 is a positive pulse $D_x$ over a line 77. Therefore, since the output on the line 52 is low, the output of the NAND gate 76 does not change state when the positive pulse $D_x$ is supplied over the line 77. Thus, the flip flop 72, which has its input C connected to the output of the NAND gate 76, does not change state.

However, if the change in current in the X alignment coil 56 caused the current in the beam 11 to decrease, then the output of the amplifier 45 is less than the output of the sample and hold circuit 51. As a result, the output on the line 52 of the comparator 50 is high so that a negative pulse appears on the output of the NAND gate 76 when the positive pulse $D_x$ is applied over the line 77. This changes the state of the flip flop 72. This results in the up down counter 73 counting in the opposite direction when the next positive pulse $C_x$ is supplied over the line 69 during the next correction of alignment for the X alignment coil 56.

As shown in FIG. 6, the $C_x$ pulse and the $D_x$ pulse are both applied when the SAMPLE pulse is low. This insures that the sample and hold circuit 51 does not change its output when the X alignment correction means 53 is making a correction.

When the $D_x$ pulse returns to zero, a positive SAMPLE pulse is supplied to the sample and hold circuit to sample the output of the amplifier 45. After the sample and hold circuit 51 stops sampling due to the SAMPLE pulse going to zero, then a positive pulse $C_Y$ is supplied over a line 80 to Y alignment correction means 55 to produce the same results as in the X alignment correction means 53. Then, a positive pulse $D_y$ is supplied over a line 81 to the Y alignment correction means 55 for the same purpose as discussed with respect to the positive pulse $D_x$ for the X alignment correction means 53.

The supply of $C_x$ and $D_x$ pulses and then the supply of $C_y$ and $D_y$ pulses occur for four cycles. There is a positive SAMPLE pulse produced on the line 75 before each $C_x$ and $C_y$ pulse as shown in FIG. 6 so that the current density produced by the beam 11 after correction of the X alignment coil 56 or the Y alignment coil 57 is compared during the correction of the other of the coils 56 and 57 with the current density the beam 11 produced before the correction.

At the completion of the fourth $D_y$ pulse on the line 81, the BEAM ON signal goes down to blank the plates 15 to turn off the beam 11. Then, after a slight delay, the OFFSET pulse goes up so that the beam 11 is deflected to the position in which the beam 11 passes through the aperture 21 in the plate 20 and the aligned aperture 43 in the sensing plate 41 for application to the target on the table 35. The electronic switch 63 also is opened when the OFFSET pulse goes up.

When the next C cycle occurs, the OFFSET and BEAM ON signals are again produced in the same manner as previously described with respect to the prior C cycle in which correction of the alignment occurred. However, the SAMPLE, $C_x$, $D_x$, $C_y$, and $D_y$ pulses are not generated during the C cycle. Instead, brightness clock pulses are supplied over a line 85 as one of the inputs to each of a pair of NAND gates 86 and 87 (see FIG. 4) of the brightness correction means 48.

As previously mentioned, the output of the amplifier 45 is supplied through the line 47 to the brightness correction means 48. The line 47 supplies the output of the amplifier 45 as an input to a window comparator 88. The window comparator 88 has its window center set by a potentiometer 89 and its window width set by a potentiometer 90.

The voltage from the window width potentiometer 90 is used with the voltage from the window center potentiometer 89 to provide an upper threshold voltage and a lower threshold voltage for the window comparator 88. The upper threshold voltage is equal to the sum of the voltage from the window center potentiometer 89 and one half of the voltage from the window width potentiometer 90 while the lower threshold voltage is equal to the difference of the voltage of the window center potentiometer 89 and one half of the voltage of the window width potentiometer 90.

If the voltage from the amplifier 45 exceeds the upper threshold voltage of the window comparator 88, a high or logical one appears on an output line 91 of the window comparator 88. The line 91 supplies the other input to the NAND gate 86.

If the line 91 has a high or logical one thereon, the NAND gate 86 has a negative output when the brightness clock pulse is applied on the line 85. As a result, a negative pulse is supplied to an up down counter 92 to count up. The increase in the output of the counter 92 causes a digital to analog converter (DAC) 93 to supply an increased voltage over a line 93' to a heater power supply 94 for the cathode of the electron gun 10. This results in the heater current being decreased to cause a decrease in the current of the beam 11 to reduce the brightness.

If the output of the amplifier 45 is less than the lower threshold voltage of the window comparator 88, then a high or logical one appears on an output line 95 of the window comparator 88. When the line 95 has a logical one thereon, the NAND gate 87 has its output change state when the line 85 has the positive brightness clock pulse thereon. Thus, the counter 92 counts down to decrease the voltage output of the DAC 93 to the heater power supply 94. This increases the heater current to increase the current in the beam 11 so that its brightness increases.

If the output of the amplifier 45 is between the upper and lower threshold levels of the window comparator 88, then each of the lines 91 and 95 has a low or logical zero thereon. As a result, the NAND gates 86 and 87 do not change state when a positive pulse is applied on the line 85. Therefore, there is no change in the heater current at this time.

The window comparator 88 has a third output line 96, which produces a high or logical one whenever the voltage on the line 47 is between the upper and lower threshold levels. This high on the line 96 activates a light to visually indicate that the brightness of the beam 11 does not need correction as it is in the desired range.

As shown in FIG. 6, two of the brightness clock pulses are produced during each of the C cycles. One appears at approximately the half way point during the C cycle, and the other appears at approximately the end of the C cycle. After the second of the brightness clock pulses is supplied over the line 85, the BEAM ON signal is reduced to zero to turn off the beam 11. After a short delay, the OFFSET signal becomes positive so that the beam 11 is again returned for application to the target through the aperture 20 in the plate 21 and the aperture 43 in the sensing plate 41.

Figure 5:
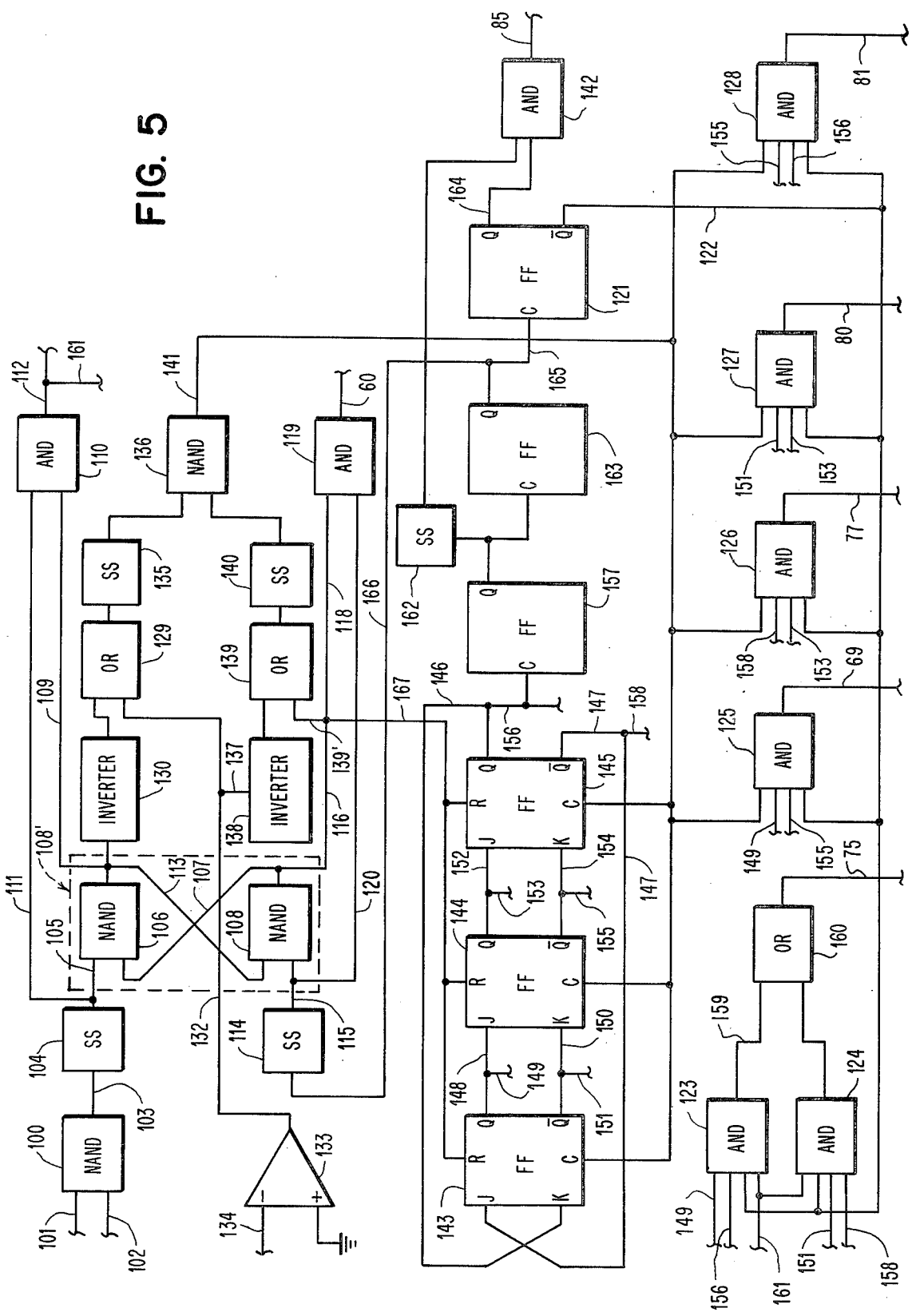
FIG. 5 is a schematic block diagram of the timing and control logic for producing signals for the circuit of FIG. 2.

Referring to FIG. 5, there is shown the circuitry, which is within the column control unit 16, for generating the pulses on the lines 60, 69, 75, 77, 80, 81, and 85. A NAND gate 100 has one input connected by a line 101 to the analog unit 17 to receive a positive pulse therefrom when a C cycle is to begin. If alignment or brightness correction is not to occur during a C cycle and this occurs about once every hour whereas there are about thirty alignment and brightness correction cycles every minute, a logical zero is supplied to the NAND gate 100 over a line 102 from the computer 19 through the digital control unit 18 and the analog unit 17. The line 102 has a high or logical one input at all other times.

Therefore, when the line 101 is high due to the C cycle starting and the line 102 is high, the NAND gate 100 has its output line 103 change state to a low. The negative going portion of the pulse from the NAND gate 100 is supplied to a single shot 104, which produces a negative going pulse for a very short period of time as shown in FIG. 6.

The negative going pulse of the single shot 104 is supplied over a line 105 as one input to a NAND gate 106. The NAND gate 106 has its other input supplied by a line 107 from the output of a NAND gate 108. The NAND gates 106 and 108 functions as a start/stop latch 10840 0 for the logic circuitry of FIG. 5.

At the time that the prior C cycle ended, the output of the NAND gate 108 was a high or logical one. Therefore, when the single shot 104 produces a negative going pulse, the output of the NAND gate 106 changes state since the NAND gate 106 now has a low input on the line 105 and a high input on the line 107 so that the output of the NAND gate 106 goes high.

This high from the NAND gate 106 is supplied over a line 109 as an input an and AND gate 110. The other input to the AND gate 110 is from the single shot 104 through a line 111. Since the output of the single shot 104 goes negative when it is fired by the negative going output of the NAND gate 100, the AND gate 110 has a high input on the line 109 and a low input on the line 111 so that its output line 112, which provides the BEAM ON signal to the blanking plates 15, remains low or logical zero.

The output of the NAND gate 106 is fed by a line 113 as one input to the NAND gate 108. The other input to the NAND gate 108 is from a single shot 114. Since the single shot 114 has a high output except when it is fired, the input to the NAND gate 108 from the single shot 114 by a line 115 is a high or logical one. Since the input to the NAND gate 108 from the output of the NAND gate 106 goes high when the NAND gate 106 changes state due to the output of the single shot 104 going negative, the NAND gate 108 changes state so that it has a low on its output line 116.

The line 116 is connected by a line 118 as an input to an AND gate 119. The other input to the AND gate 119 is from the output line 115 of the single shot 114 through a line 120. The output of the single shot 114 is high since the single shot 114 does not fire at this time. Accordingly, when the NAND gate 108 has its output change state so that it goes low due to the single shot 104 firing to change the state of the NAND gate 106, the output of the AND gate 119 changes state so that the output line 60, which provides the OFFSET signal, goes to a logical zero.

When the single shot 104 ceases to supply the negative pulse as its output, the line 111 supplies a high or logical one to the AND gate 110. As a result, a high or logical one appears on the line 112 to supply the positive BEAM ON signal. This occurs a short period of time after the OFFSET signal on the line 60 has gone to logical zero. This delay is due to the single shot 104 remaining on for a period of time greater than that in which the AND gate 119 can change state. This relation is shown in FIG. 6.

When the single shot 104 has its output go positive, there is no change in the state of the output of the NAND gate 106 because the line 107 is supplying a low input to the NAND gate 106 from the output of the NAND gate 108. Thus, the NAND gates 106 and 108 remain in their states in which the output of the NAND gate 106 is high and the output of the NAND gate 108 is low.

As shown in FIG. 6, the start/stop latch 108' is on when the OFFSET signal is low to deflect the beam 11 to the sample aperture 40 in the plate 21. The OFFSET signal goes down and the start/stop latch 108' turns on when the single shot 104 has its output go negative.

If it is assumed that the brightness cycle occurred during the prior C cycle, then a flip flop 121 (see FIG. 5) has its $\bar{Q}$ output produce a high or logical one on its output line 122. The line 122 supplies the $\bar{Q}$ output of the flip flop 121 as an input to each of AND gates 123, 124, 125, 126, 127, and 128.

The output of the NAND gate 106 also is supplied as one input to an OR gate 129 after having the output inverted by an inverter 130. The other input to the OR gate 129 is through a line 132 from the output of a comparator 133.

The comparator 133 has its positive input grounded and its negative input connected to a sixty hertz sine wave generator through a line 134. As a result, the output of the comparator 133 is sixty hertz square wave as shown in FIG. 6.

Thus, since the input to the OR gate 129 from the NAND gate 106 is low because of the inverter 130, a positive pulse is supplied from the OR gate 129 to a single shot 135, which fires on the negative going portion of the positive pulse from the OR gate 129, every time that the positive portion of the square wave output of the comparator 133 is supplied to the OR gate 129. The output of the single shot 135 is a negative pulse supplied as one input to a NAND gate 136.

The output line 132 of the comparator 133 also is connected through a line 137 and an inverter 138 to an input of an OR gate 139. The other input to the OR gate 139 is the output of the NAND gate 108 through the line 116 and a line 139'.

Since the output of the NAND gate 108 is negative, the OR gate 139 produces a positive output on each negative portion of the square wave output of the comparator 133. This is the opposite time to when the OR gate 129 is producing an output. The OR gate 139 causes a single shot 140 to fire on the negative going portion of the positive output of the OR gate 139. The single shot 140 supplies its negative output pulse as the other input to the NAND gate 136.

Accordingly, the single shots 135 and 140 produce negative outputs at opposite times so that the NAND gate 136 is changing state at twice the frequency of the square wave output of the comparator 133. Therefore, the NAND gate 136 produces a positive pulse on its output line 141 each time that either of the single shots 135 and 140 is fired. The relationship of the output of the comparator 133 and the pulses on the line 141 is shown in FIG. 6.

The output of the NAND gate 136 is supplied by the line 141 as an input to the AND gates 125, 126, 127, and 128 and to clock inputs C of JK flip flops 143, 144, and 145. The JK flip flops 143, 144, and 145 are fired on the negative going portion of the positive clock pulse on the line 141.

When the first clock pulse appears on the line 141 at the time that the start/stop latch 108' has been turned on, the flip flop 143 has its Q output go up and its $\bar{Q}$ output go down. This is because input J of the flip flop 143 is high and input K of the flip flop 143 is low at this time since $\bar{Q}$ output of the flip flop 145 is high and Q output of the flip flop 145 is low. The Q output of the flip flop 145 is connected by a line 146 to the K input of the flip flop 143, and the $\bar{Q}$ output of the flip flop 145 is connected by a line 147 to the J input of the flip flop 143.

The positive pulse of the Q output of the flip flop 143 is supplied over a line 148 to input J of the flip flop 144 and over a line 149 as an input to the AND gates 123 and 125. The zero or low pulse of the $\bar{Q}$ output of the flip flop 143 is supplied by a line 150 to input K of the flip flop 144 and by a line 151 as an input to the AND gates 124 and 127.

At the time that the clock pulse is supplied over the line 141 to the flip flop 143 to cause the Q output of the flip flop 143 to go up and the $\bar{Q}$ output of the flip flop 143 to go down, the flip flop 144 does not change state so that its Q output is low and its $\bar{Q}$ output is high. This is because the J input of the flip flop 144 was low and the K input of the flip flop 144 was high since these were the states of the Q and $\bar{Q}$ outputs of the flip flop 143 prior to the clock pulse changing the state of the flip flop 143.

The Q output of the flip flop 144 is connected by a line 152 to input J of the flip flop 145 and by a line 153 as an input to the AND gates 126 and 127. The $\bar{Q}$ output of the flip flop 144 is connected by a line 154 to input K of the flip flop 145 and by a line 155 as an input to the AND gates 125 and 128.

Thus, at the time that the flip flop 143 has the Q and $\bar{Q}$ outputs change state, the Q and $\bar{Q}$ outputs of the flip flop 145 do not change state. This is because the J input of the flip flop 145 is low and the K input of the flip flop 145 is high. This results in the Q output of the flip flop 145 remaining low and the $\bar{Q}$ output remaining high.

In addition to the Q output of the flip flop 145 being connected by the line 146 to the K input of the flip flop 143, the Q output of the flip flop 145 also is connected by a line 156 as an input to the AND gates 123 and 128 and also as an input to clock input C of a flip flop 157. In addition to the $\bar{Q}$ output of the flip flop 145 being connected by the line 147 to the J input of the flip flop 143, the $\bar{Q}$ output of the flip flop 145 also is connected by a line 158 as an input to the AND gates 124 and 126.

Accordingly, only the Q output of the flip flop 143 is high, as shown in FIG. 6, at the time that the first clock pulse is produced on the line 141 from the NAND gate 136. When the second clock pulse appears on the line 141, the Q and $\bar{Q}$ outputs of the flip flop 143 remains the same. Since the J input of the flip flop 144 is now high and the K input of the flip flop 144 is low because of the Q and $\bar{Q}$ output of the flip flop 143 changing state on the negative going portion of the prior clock pulse on the line 141, the Q output of the flip flop 144 goes high while the $\bar{Q}$ output of the flip flop 144 goes low.

Just prior to the flip flop 144 changing state due to the second clock pulse on the line 141 since the flip flops 143-145 do not change state until the negative going portion of the pulse occurs, the AND gate 125 supplies the positive $C_x$ pulse on the line 69 since all four inputs to the AND gate 125 are high. That is, just prior to the flip flop 144 changing state, the line 155 is high, the line 149 is high since the flip flop 143 changed state on the negative going portion of the prior clock pulse on the line 141, the pulse on the line 122 from the flip flop 121 is high, and the clock pulse on the line 141 is high.

Shortly after the $C_x$ pulse is produced from the AND gate 125 on the line 69, it ceases since the clock pulse on the line 141 goes negative. This relationship is shown in FIG. 6.

When the flip flop 144 changes state, its Q output goes up and its $\bar{Q}$ output goes down. This provides a high to the J input of the flip flop 145 and a low to the K input of the flip flop 145. Therefore, when the next clock pulse is supplied from the line 141, the flip flop 145 will have its Q output go up and its $\bar{Q}$ output go down on the negative going portion of the positive clock pulse on the line 141.

However, prior to the flip flop 145 changing state, the pulse $D_x$ is produced on the line 77 from the AND gate 126 since all four of its inputs are up at the time that the third positive clock pulse on the line 141 is supplied. At this time, the line 158 is still high because the flip flop 145 has not changed state, the line 153 is high, the line 122 is high, and the line 141 is high. The pulse $D_x$ stops as soon as the pulse on the line 141 goes low.

When the flip flop 145 changes state, the AND gate 123 has a positive output on its output line 159 to an OR gate 160. This is because the lines 149 and 156 are both high as are the line 122 from the flip flop 121 and a line 161 from the AND gate 110. The AND gate 110 is providing the positive BEAM ON pulse. The OR gate 160 provides the positive SAMPLE pulse on the line 75.

The next positive clock pulse on the line 141 causes the Q output of the flip flop 143 to go low and the $\bar{Q}$ output on the flip flop 143 to go high. This is because the Q output of the flip flop 145 went high so that the K input of the flip flop 143 is now high and the $\bar{Q}$ output of the flip flop 145 went low so that the J input of the flip flop 143 is now low.

When the flip flop 143 changes state so that its Q output goes down, the line 149 goes low so that the AND gate 123 no longer has a positive output on the line 159. As a result, the positive SAMPLE pulse on the line 75 is turned off since the OR gate 160 does not have a high input.

The next positive clock pulse on the line 141 causes the flip flop 144 to change state on the negative going portion thereof. However, prior to the flip flop 144 changing state so that its Q goes low and its $\bar{Q}$ output goes high, the AND gate 127 produces a positive pulse $C_y$ on the line 80. This is because the clock pulse on the line 141 is high, the line 151 from the $\bar{Q}$ output of the flip flop 143 is high, the line 153 is high because the Q output of the flip flop 144 is still high, and the output of the flip flop 121 on the line 122 is high. As soon as the positive clock pulse on the line 141 goes low, the AND gate 127 ceases to supply the positive $C_y$ pulse on the line 80.

The next positive clock pulse on the line 141 causes the flip flop 145 to change state. However, prior to the flip flop 145 changing state on the negative going portion of the positive clock pulse on the line 141, the AND gate 128 supplies the positive $D_y$ pulse on the line 81. This is because the inputs from the line 141, the line 122, the line 155, and the line 156 are all high. However, as soon as the positive clock pulse on the line 141 goes down, the $D_y$ pulse is turned off.

When the flip flop 145 changes state so that its Q output goes low and its $\bar{Q}$ output goes high, the J and K inputs of the flip flop 143 are again reversed. Furthermore, when the Q output of the flip flop 145 goes low, the flip flop 157 changes state since it is responsive to a negative going input pulse so that its Q output goes high.

The Q output of the flip flop 157 is supplied as an input to a single shot 162, which produces a positive pulse only when the Q output of the flip flop 157 goes negative. The Q output of the flip flop 157 also is supplied to clock input C of a flip flop 163.

The flip flop 163 does not change state except on a negative going signal. Since the Q output of the flip flop 157 goes up, the single shot 162 does not fire and the flip flop 163 does not change state at this time so that its Q output remains down.

Thus, the AND gate 142 will not conduct since its two inputs from the output of the single shot 162 and the Q output of the flip flop 121 remain low. The Q output of the flip flop 121 is connected to the AND gate 142 by a line 164.

The next clock pulse on the line 141 again causes the flip flop 143 to change state so that the Q output of the flip flop 143 goes up as shown in FIG. 6. The clock pulses proceed in the same manner as previously described until the flip flop 145 again changes state so that its Q output goes down. When this occurs, the flip flop 157 changes state so that its Q output goes negative.

As a result of the Q output of the flip flop 157 going negative, the single shot 162 fires to produce a positive output pulse and the flip flop 163 changes state to have its Q output go positive. While the Q output of the flip flop 163 is connected by a line 165 to clock input C of the flip flop 121 and by a line 166 to the single shot 114, neither the flip flop 121 nor the single shot 114 is affected by the positive going pulse on the output Q of the flip flop 163. Thus, the AND gate 142 still has a low output because of the low input on the line 164.

As shown in FIG. 6, the flip flops 143, 144, 145, and 157 continue to change state until the flip flop 157 had its Q output again go negative just after the fourth $D_y$ pulse is supplied over the line 81. When the flip flop 157 changes state so that its Q output goes negative, the single shot 162 goes positive and the flip flop 163 changes state so that its output goes negative. The negative going signal from the Q output of the flip flop 163 causes the flip flop 121 to change state and the single shot 114 to produce a negative pulse on the line 115. The changing of the state of the flip flop 121 causes the Q output to go up and the $\bar{Q}$ output to go down, but this occurs after the single shot 162 ceases to produce a positive pulse so that the AND gate 142 does not supply a positive pulse on the line 85.

The negative going signal from the single shot 114 causes the NAND gate 108 to have its output changed from a low to a high since the line 115 now has a low thereon. Since the output of the single shot 114 on the line 115 went negative prior to the output of the NAND gate 108 going up, the AND gate 119 has a low input on the line 120 before it receives a high input on the line 118 from the output of the NAND gate 108. Thus, the output line 60 of the AND gate 119 remains low as long as the single shot 114 is producing a negative pulse on the line 115.

The changing of the output of the NAND gate 108 to a high results in the output of the NAND gate 106 going low since both of its inputs are now high. The low output of the NAND gate 106 is transmitted by the line 109 to the AND gate 110 to cause the output line 112 to have a low whereby the BEAM ON signal goes low to turn off the beam 11.

The single shot 114 ceases to supply the negative pulse shortly after the AND gate 110 has the output line 112 go low. As a result, the two inputs to the AND gate 119 are now high to produce a high on the line 60 so that the OFFSET pulse goes up to return the beam 11 to the position in which it is applied to the target.

As shown in FIG. 6, the start/stop latch 108' goes off as soon as the output of the NAND gate 106 changes state. Thus, the latch 108' goes off at the same time that the BEAM ON signal goes down.

When the next C cycle occurs, the single shot 104 is again fired in the same manner to first apply a low on the line 60 and then a high on the line 122. Since the $\overline{Q}$ output of the flip flop 121 is now low, none of the AND gates 123-128 can be activated during this C cycle. As a result, the X alignment correction means 53 and the Y alignment correction means 55 cannot be activated during this C cycle. Instead, only the AND gate 142 can be activated to produce brightness clock pulses on the line 85.

The AND gate 142 can only be activated when there is a positive pulse from the single shot 162 and a positive pulse on the line 164. The positive pulse on the line 164 remains throughout the brightness correction cycle.

The positive pulse from the single shot 162 occurs only when the flip flop 157 has its Q output go down. Thus, as shown in FIG. 6, there are two brightness clock pulses on the line 85 during each brightness correction cycle.

As the C cycle for brightness correction nears completion, the remainder of the operation is the same as in the alignment correction cycle in that the flip flop 121 changes state when the Q output of the flip flop 163 goes negative. This also is when the single shot 114 supplies its negative going pulse. Thus, the flip flop 121 now has the $\overline{Q}$ output up and the Q output down so that the next C cycle will produce correction for alignment. The flip flop 121 does not change state until after the positive pulse from the single shot 162 so that the AND gate 142 can supply the second positive pulse on the line 85.

Since there is no synchronization of the start of a C cycle with the output of the comparator 133, it should be understood that the output of the comparator 133 can be in a transition from positive to negative or negative to positive at any time. Thus, the length of the SAMPLE pulse, which occurs between the time when the BEAM ON signal goes positive and the output of the comparator 133 changes from positive to negative or negative to positive to produce a positive pulse on the line 141, can vary significantly.

When the BEAM ON signal on the line 112 goes positive prior to the first positive pulse appearing on the line 141 as shown in FIG. 6, the AND gate 124 (see FIG. 5) provides a positive output to the OR gate 160 so that a positive SAMPLE pulse is supplied by the line 75 to the sample and hold circuit 51 as shown in FIG. 6. This is because the $\overline{Q}$ outputs of the flip flops 143 and 145 are up prior to the first pulse appearing on the line 141 so that the inputs on the lines 151 and 158, respectively, to the AND gate 124 are high. The BEAM ON signal over the line 161 from the line 112 is high, and the output from the $\overline{Q}$ output of the flip flop 121 is high since this is the alignment cycle.

While the period of time for the AND gate 124 to supply a positive SAMPLE pulse on the line 75 varies significantly depending on when the output of the comparator 133 changes from positive to negative or negative to positive after the BEAM ON signal has gone up, only a relatively short period of time is needed for a full sampling. If the time before the first pulse appears on the line 141 to change the state of the flip flop 143 is not sufficient to have a full sampling, then the sample and hold circuit 51 will have a sampling of a portion of the signal during this cycle and a portion from the prior alignment cycle.

If the output of the comparator 133 should be in a transition from positive to negative or negative to positive when the start/stop latch 108' changes state and before the BEAM ON signal goes positive, then there will be no SAMPLE pulse supplied to the sample and hold circuit 51 prior to the first pulse on the line 141. This would result in the sample of only the prior alignment cycle being utilized for the first comparison. However, this will normally not occur because of the lack of the synchronization between the start of the C cycle and the output of the comparator 133. Thus, the width of the first SAMPLE pulse can vary from a minimum of zero to a maximum of the reciprocal of the frequency of the pulses on the line 141.

Considering the operation of the present invention, the beam 11 is initially offset from the aperture 20 in the plate 21 to the sample aperture 40. With the beam 11 deflected within the sample aperture 40, the blanking plates 15 are turned off so that the beam 11 is turned on. Thereafter, the clock pulses from the NAND gate 136 are supplied on the line 141 to cause the various logic signals to be produced in the desired timing relation.

During an alignment cycle, there are four correction signals to the X alignment coil 56 and four correction signals to the Y alignment coil 57. These correction signals are supplied alternately.

During the brightness correction cycle, there can be two corrections to the heater power supply 94. Of course, if the output of the amplifier 45 is between the upper and lower threshold levels of the window comparator 88, there will be no supply to the heater power supply 94. Thus, the heater power supply 94 could receive zero, one, or two correction signals from the brightness correction means 48 during each of the C cycles in which brightness of the beam 11 is being ascertained.

When the circuit is first turned on, it is necessary that the flip flops 143, 144, and 145 have their Q outputs low and their Q̄ outputs high. Accordingly, the output line 116 of the NAND gate 108 also is connected by a line 167 to reset input R of each of the flip flops 143, 144, and 145. This provides a reset signal on the negative going portion of the output of the NAND gate 108. This occurs as soon as a C cycle begins but before the BEAM ON signal is supplied from the AND gate 110.

It should be understood that the brightness clock pulses have been shown in FIG. 6 as occurring when the Q output of the flip flop 121 is low for comparison purposes with all of the other pulses. However, as explained, the brightness clock pulses actually occur when the Q output of the flip flop 121 is high.

While the present invention has been shown and described with respect to a square shaped beam, it should be understood that it could be utilized with any shaped beam. It is only necessary that the beam 11 be capable of having the magnitude of its current ascertained.

An advantage of this invention is that optimum brightness of a beam of charged particles can be obtained after obtaining optimum alignment of the beam and vice versa. Another advantage of this invention is that it increases the life of a beam of charged particles. A further advantage of this invention is that it enables a beam of specified total current and symmetrical current distribution to be maintained.

While the invention has been particularly shown and described with reference to a preferred embodiment thereof, it will be understood by those skilled in the art that various changes in form and details may be made therein without departing from the spirit and scope of the invention.

What is claimed is:

1. An apparatus for maintaining a substantially uniform current density of a beam of charged particles applied to a target including:
   means to align the beam;
   means to control the brightness of the beam;
   and means to alternately cause each of said aligning means and said brightness control means to be effective when the beam is not applied to the target.

2. The apparatus according to claim 1 including:
   means to produce a signal related to the current density of the beam when each of said aligning means and said brightness control means is effective;
   means to supply the output of said producing means to each of said aligning means and said brightness control means;
   said aligning means including means to regulate the alignment in accordance with the output signal from said producing means;
   and said brightness control means includes means to regulate the brightness of the beam in accordance with the output signal from said producing means.

3. The apparatus according to claim 2 in which said brightness control means includes means to produce a first output if the output of said signal producing means is below a first predetermined level to change the brightness level in one direction and to produce a second output if the output of said signal producing means is above a second predetermined level greater than the first predetermined level to change the brightness level in the other direction.

4. The apparatus according to claim 3 in which said producing means of said brightness control means includes:
   means to compare the output of said signal producing means with the first and second predetermined levels;
   said comparing means producing the first output when the output of said signal producing means is below the first predetermined level and the second output when the output of said signal producing means is above the second predetermined level;
   and means responsive to the first and second outputs of said comparing means to change the brightness level of the beam in the correct direction.

5. The apparatus according to claim 4 in which said responsive means includes means to change the temperature of the cathode producing the beam while the cathode emission is held at a level to enable the temperature of the cathode and the brightness level to be independent thereof so that the brightness level is directly related to the temperature of the cathode.

6. An apparatus for maintaining a substantially uniform brightness of a beam of charged particles including:
   means to measure the brightness of the beam;
   and means to produce a first output if the output of said measuring means is below a first predetermined level to change the brightness level in one direction and to produce a second output if the output of said measuring means is above a second predetermined level greater than the first predetermined level to change the brightness level in the other direction.

7. The apparatus according to claim 6 in which said producing means includes:
   means to compare the output of said measuring means with the first and second predetermined levels;
   said comparing means producing the first output when the output of said measuring means is below the first predetermined level and the second output when the output of said measuring means is above the second predetermined level;
   and means responsive to the first and second outputs of said comparing means to change the brightness level of the beam in the correct direction.

8. The apparatus according to claim 7 in which said measuring means includes means to produce an output related to the current of the beam.

9. The apparatus according to claim 8 in which said responsive means includes means to change the temperature of the cathode producing the beam while the cathode emission is held at a level to enable the temperature of the cathode and the brightness level to be independent thereof so that the brightness level is directly related to the temperature of the cathode.

10. The apparatus according to claim 7 in which said responsive means includes means to change the temperature of the cathode producing the beam while the cathode emission is held at a level to enable the temperature of the cathode and the brightness level to be independent thereof so that the brightness level is directly related to the temperature of the cathode.

11. The apparatus according to claim 6 in which said measuring means includes means to produce an output related to the current of the beam.

12. A method for maintaining a substantially uniform current density of a beam of charged particles applied to a target including:
applying the beam to the target for a predetermined period of time;
and alternately aligning the beam and controlling the brightness of the beam when the beam is not applied to the target with each of the aligning and controlling occurring during a predetermined period of time between the periods of time when the beam is applied to the target.

13. The method according to claim 12 including:
producing a signal related to the current density of the beam when aligning the beam or controlling the brightness of the beam;
regulating the alignment of the beam in accordance with the magnitude of the produced signal;
and regulating the brightness of the beam in accordance with the magnitude of the produced signal.

14. The method according to claim 13 including:
changing the brightness level of the beam in one direction if the magnitude of the produced signal is less than a first predetermined magnitude;
and changing the brightness level of the beam in the other direction if the magnitude of the produced signal is greater than a second predetermined magnitude that is greater than the first predetermined magnitude.

15. The method according to claim 14 including changing the brightness level of the beam by changing the temperature of the cathode producing the beam while the cathode emission is held at a level to enable the temperature of the cathode and the brightness level of the beam to be independent thereof so that the brightness level is directly related to the temperature of the cathode.

16. A method for maintaining a substantially uniform brightness of a beam of charged particles applied to a target including:
producing a signal related to the brightness of the beam;
changing the brightness level of the beam in one direction if the magnitude of the produced signal is less than a first predetermined magnitude;
and changing the brightness level of the beam in the other direction if the magnitude of the produced signal is greater than a second predetermined magnitude that is greater than the first predetermined magnitude.

17. The method according to claim 16 including producing a signal related to the total current of the beam as the produced signal related to the brightness of the beam.

18. The method according to claim 17 including changing the brightness level of the beam by changing the temperature of the cathode producing the beam while the cathode emission is held at a level to enable the temperature of the cathode and the brightness level of the beam to be independent thereof so that the brightness level is directly related to the temperature of the cathode.

19. The method according to claim 16 including changing the brightness level of the beam by changing the temperature of the cathode producing the beam while the cathode emission is held at a level to enable the temperature of the cathode and the brightness level of the beam to be independent thereof so that the brightness level is directly related to the temperature of the cathode.

* * * * *